(12) United States Patent
Xie et al.

(10) Patent No.: US 10,446,792 B2
(45) Date of Patent: Oct. 15, 2019

(54) PACKAGING STRUCTURE, DISPLAY DEVICE, AND FABRICATION METHOD THEREOF

(71) Applicants: Shanghai Tianma AM-OLED Co., Ltd., Shanghai (CN); Tianma Micro-electronics Co., Ltd., Shenzhen (CN)

(72) Inventors: Zaifeng Xie, Shanghai (CN); Huamin Li, Shanghai (CN); Pei Wu, Shanghai (CN); Xiongjie Jin, Shanghai (CN)

(73) Assignees: Shanghai Tianma AM-OLED Co., Ltd., Shanghai (CN); Tianma Micro-electronics Co., Ltd., Shenzhen (CN)

( * ) Notice: Subject to any disclaimer, the term of this patent is extended or adjusted under 35 U.S.C. 154(b) by 74 days.

(21) Appl. No.: 15/150,503

(22) Filed: May 10, 2016

(65) Prior Publication Data

US 2017/0155089 A1    Jun. 1, 2017

(30) Foreign Application Priority Data

Nov. 26, 2015    (CN) .......................... 2015 1 0844324

(51) Int. Cl.
*H01L 51/52*    (2006.01)
*H01L 51/56*    (2006.01)

(52) U.S. Cl.
CPC .......... *H01L 51/5256* (2013.01); *H01L 51/56* (2013.01)

(58) Field of Classification Search
CPC ... C23C 28/04; C23C 28/048; C03C 17/3452; C03C 3/062
See application file for complete search history.

(56) References Cited

U.S. PATENT DOCUMENTS 3,073,770 A * 1/1963 Williams ................ C01B 33/26
                                                  204/192.12
5,453,494 A * 9/1995 Kirlin .................... C23C 16/18
                                                  427/248.1
(Continued)

FOREIGN PATENT DOCUMENTS

CN    1706226 A    12/2005
CN    101901839 A    12/2010
(Continued)

OTHER PUBLICATIONS

The Physics and Technology of Amorphous SiO2, edited by A.B. Devine. 1987, 552.*

(Continued)

*Primary Examiner* — Humera N Sheikh
*Assistant Examiner* — Elizabeth D Ivey
(74) *Attorney, Agent, or Firm* — Anova Law Group, PLLC

(57) ABSTRACT

A packaging structure includes at least one inorganic layer and at least one passivation layer. The at least one passivation layer includes a halogen-containing amorphous solid oxide thin film. The amorphous solid oxide thin film in the at least one passivation layer has a crosslinked-polyhedra-network structure. A display device includes a substrate, a display layer, and a packaging structure. The packaging structure further includes at least one inorganic layer and at least one passivation layer. The at least one passivation layer includes a halogen-containing amorphous solid oxide thin film. The amorphous solid oxide thin film in the at least one passivation layer has a crosslinked-polyhedra-network structure. A method for fabricating a display device includes providing a substrate, forming a display layer over the substrate, and forming a packaging structure over the display layer with the packaging structure including at least one inorganic layer and at least one passivation layer.

17 Claims, 5 Drawing Sheets

(56) References Cited

U.S. PATENT DOCUMENTS

| | | | |
|---|---|---|---|
| 6,515,787 B1* | 2/2003 | Westfall | G02F 1/1523 |
| | | | 359/265 |
| 2007/0159094 A1 | 7/2007 | Oh et al. | |
| 2008/0146431 A1* | 6/2008 | Aitken | C03C 3/247 |
| | | | 501/44 |
| 2013/0065066 A1* | 3/2013 | Sambasivan | C03C 1/008 |
| | | | 428/432 |
| 2015/0014151 A1* | 1/2015 | Shin | C23C 14/3414 |
| | | | 204/192.26 |

FOREIGN PATENT DOCUMENTS

| | | | | |
|---|---|---|---|---|
| CN | 102569678 A | 7/2012 | | |
| CN | 104157790 A | 11/2014 | | |
| TW | I377186 B | 11/2012 | | |
| WO | WO 2008045249 A2 * | 4/2008 | | C03C 3/247 |
| WO | 2008045249 A3 | 5/2008 | | |

OTHER PUBLICATIONS

Kaneko et. al. Bul. of The Japan Pet. Institutevol. 16, No. 1, 1974, 24-30.*

Mohammadi et. al. Acta Biomaterialia, 8, 2012, 1616-1626.*

* cited by examiner

PACKAGING STRUCTURE, DISPLAY DEVICE, AND FABRICATION METHOD THEREOF

CROSS-REFERENCES TO RELATED APPLICATIONS

This application claims the priority of Chinese patent application No. 201510844324.8, filed on Nov. 26, 2015, the entirety of which is incorporated herein by reference.

FIELD OF THE DISCLOSURE

The present disclosure generally relates to the field of display technology and, more particularly, relates to a packaging structure, a display device, and fabrication process thereof.

BACKGROUND

Compared to liquid crystal display (LCD), organic light-emitting diode (OLED) device may have less energy consumption but high brightness and high response speed due to its self-light-emitting capability. In addition, OLED device may also be used to fabricate flexible display. As such, OLED has become a mainstream device in the field of display technology.

The essential basis for OLED products to have a wide range of applications is that the device can be operated durably, stably, and continuously. However, after a certain period of time of operation, black spots may appear in the light-emitting components of the OLED device while gas bubbles may also appear in the electrodes, causing device failure. In addition to thermal effect of the organic function layer in the device, black spots and gas bubbles may occur due to chemical reactions of the cathode and the organic function layer of the device with water vapor and oxygen permeated from outside of the device.

In order to improve the lifetime of OLED products, packaging process may be required so that the device may be isolated from external water vapor and oxygen. However, in current practice, the barrier layer used for packaging is usually made of inorganic material, which may still have some problems. For example, the barrier layer may be formed by multiple thin-film layers made of inorganic materials. In such a barrier layer, the internal stress after the deposition of the films may be relatively large, thus the reliability of the product may be low. In addition, the deposition method of inorganic material may inevitably induce defects such as little cracks, impurities, etc., which may further affect the packaging results. Moreover, an overlapping structure with multiple alternatingly-stacked organic and inorganic layers is commonly used in current packaging structures to reduce the stress in each inorganic layer. However, such an overlapping multiple-layer structure usually needs to have 7 or more layers in order to effectively relieve the stress, thus the manufacturing cost may increase while the fabrication process may become more complicated.

The disclosed packaging structures, display devices, and fabrication methods are directed to solve one or more problems set forth above and other problems in the art.

BRIEF SUMMARY OF THE DISCLOSURE

One aspect of the present disclosure includes a packaging structure. The packaging structure includes at least one inorganic layer and at least one passivation layer. The at least one passivation layer further includes a halogen-containing amorphous solid oxide thin film. Moreover, the amorphous solid oxide thin film in the at least one passivation layer has a crosslinked-polyhedra-network structure.

Another aspect of the present disclosure provides a display device. The display device includes a substrate, a display layer disposed over the substrate, and a packaging structure disposed over the display layer. The packaging structure further includes at least one inorganic layer and at least one passivation layer. The at least one passivation layer includes a halogen-containing amorphous solid oxide thin film. Moreover, the amorphous solid oxide thin film in the at least one passivation layer has a crosslinked-polyhedra-network structure.

Another aspect of the present disclosure provides a method for fabricating a display device. The method includes providing a substrate, forming a display layer over the substrate, and forming a packaging structure over the display layer. The formed packaging structure further includes at least one inorganic layer and at least one passivation layer. The at least one passivation layer includes a halogen-containing amorphous solid oxide thin film. Moreover, the amorphous solid oxide thin film in the at least one passivation layer has a crosslinked-polyhedra-network structure.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
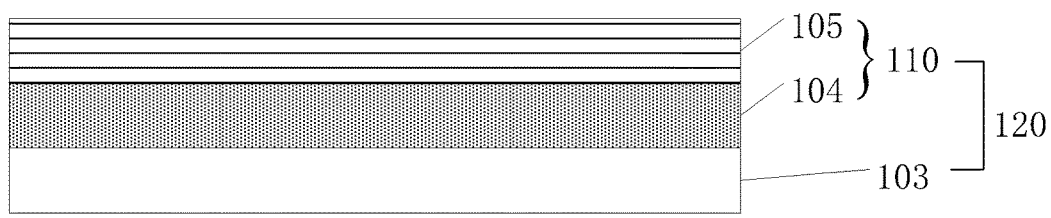
FIG. 1 illustrates a schematic view of an exemplary packaging structure consistent with disclosed embodiments.

The present disclosure provides a packaging structure. FIG. 1 shows a schematic view of an exemplary packaging structure. Referring to FIG. 1, the exemplary packaging structure 100/120 may include at least one inorganic layer 103 and at least one passivation layer 110. The passivation layer 110 may further include an amorphous solid oxide thin film that contains halogen elements. The amorphous solid oxide thin film may have a crosslinked-polyhedra-network structure.

In one embodiment, the packaging structure 100/120 may include a halogen-containing amorphous solid oxide thin film. The chemical structure of the halogen-containing amorphous solid oxide thin film may be a crosslinked-polyhedra-network structure. The amorphous solid oxide thin film may be sufficiently dense to effectively counterbalance the negative influence of cracks formed in the inorganic layer 103 during the fabrication process. In addition, the passivation layer 110 may have desired hydrophobic properties, thus may further prevent water vapor and oxygen from eroding components inside of the packaging structure 100. In one embodiment, the packaging structure 100 may be an encapsulation structure.

The inorganic layer 103 may be made of one or more of $SiO_2$, $AlO_x$, SiN, SiON, and SiOC.

Figure 2:
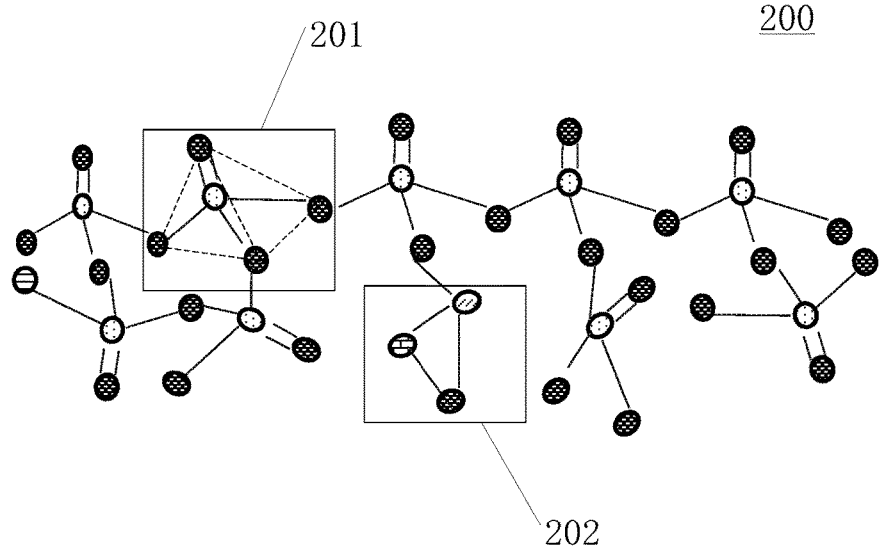
FIG. 2 illustrates a schematic structural view of an exemplary crosslinked-polyhedra-network structure adopted in packaging structures consistent with disclosed embodiments.

FIG. 2 shows a schematic view of the crosslinked-polyhedra-network structure. Referring to FIG. 2, the crosslinked-polyhedra-network structure 200 may include a plurality of polyhedra 201. The plurality of polyhedra 201 may be randomly cross-linked together to form the crosslinked-polyhedra-network structure 200. Each polyhedron 201 may be formed by a plurality of atoms connected through chemical bonds.

The crosslinked-polyhedra-network structure 200 shown in FIG. 2 is described to illustrate the chemical structure of the passivation layer. In other embodiments, the amorphous solid oxide thin-film layer may have any other appropriate structures. Further, instead of representing actual chemical bonds, the dashed lines connecting the atoms in each polyhedron 201 are auxiliary lines used to illustrate the polyhedron structure. Note that the structure shown in FIG. 2 is for illustration purposes and not necessarily representing the entire structure of the disclosed material.

In one embodiment, each polyhedron 201 has a three-dimensional structure formed by a plurality of atoms together with a plurality of corresponding interconnected chemical bonds. The plurality of polyhedra 201 may be randomly cross-linked together to form a crosslinked-polyhedra-network structure. The crosslinked-polyhedra-network structure may not be regularly or uniformly ordered over a long range but, to some extent, may be regularly or uniformly ordered in short ranges. Further, the halogen-containing amorphous solid oxide thin film having the crosslinked-polyhedra-network structure may have a desired density. Therefore, the halogen-containing amorphous solid oxide thin film may be able to efficiently block external water vapor and oxygen.

In one embodiment, the polyhedra 201 may have one or more structures including tetrahedron, hexahedron, octahedron, and icosahedron. In other embodiments, the polyhedra 201 may also include any other appropriate three-dimensional structures.

Referring to FIG. 2, in one embodiment, the crosslinked-polyhedra-network structure 200 may also include a plurality of two-dimensional chemical bond structures 202. The plurality of two-dimensional chemical bond structures 202 may be one or more of a single bond structure, a triangular structure, and a polygonal structure. Specifically, in a polygonal structure, the atoms may be situated in a two-dimensional plane, thus may not form any three-dimensional structure.

In one embodiment, the plurality of polyhedra 201 may also be randomly cross-linked with two-dimensional chemical band structures 202 to form a complex and non-ordered crosslinked-polyhedra-network structure 200. In addition, in addition to the single bond structure, triangular structures, and polygonal structures, the two-dimensional chemical bond structures may also include other two-dimensional structures as long as all the atoms are situated in a same plane.

In one embodiment, referring to FIG. 1, the passivation layer 110 may include a first active thin-film layer 104 and a second active thin-film layer 105. The mole ratio of oxygen atom to halogen atom in the first active thin-film layer 104 may be different from the mole ratio of oxygen atom to halogen atom in the second active thin-film layer 105.

Because of the distinct mole ratios of oxygen atom to halogen atom, the first active thin-film layer 104 and the second active thin-film layer 105 may have different properties. Specifically, the first active thin-film layer 104 may demonstrate better hydrophobic properties while the second active thin-film layer 105 may show a denser texture than the first active thin-film layer 104. As such, the overall passivation layer 110 may show better performance in preventing water vapor from invading.

Figure 3:
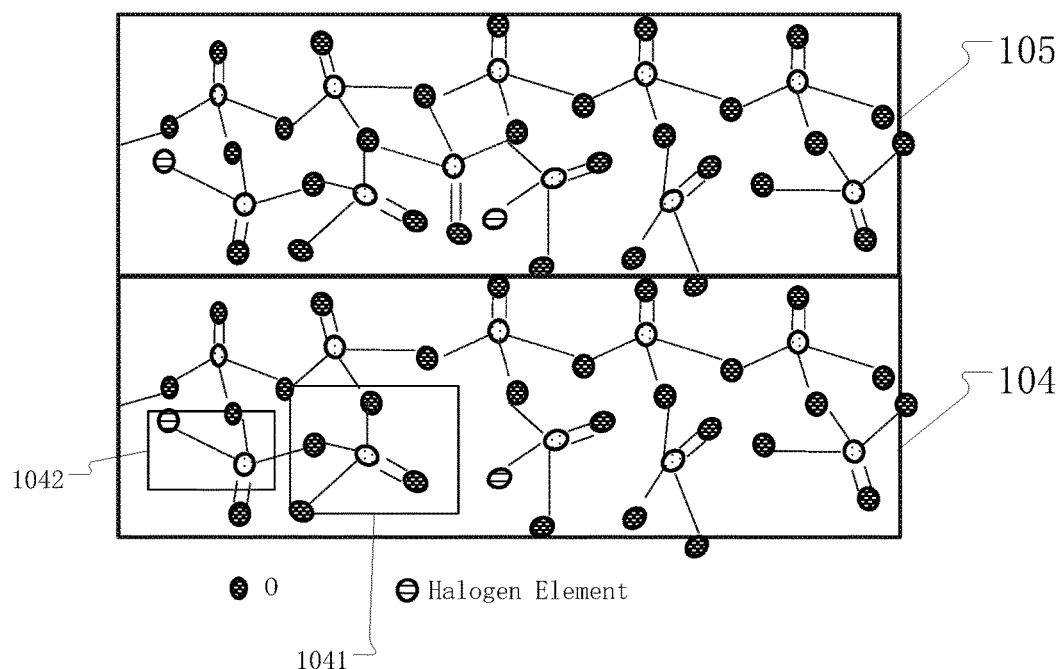
FIG. 3 illustrates a schematic micro-structural view of an exemplary passivation layer formed in packaging structures consistent with disclosed embodiments.

In the following, examples will be provided to illustrate the structure and the function of the passivation layer. FIG. 3 shows a schematic micro-structural view of a passivation layer formed in packaging structures consistent with disclosed embodiments. For illustration purposes, only a portion of the passivation layer is shown in FIG. 3. Moreover, the composition of each thin film included in the structure described below merely illustrates the constructive principle of the disclosed passivation layer.

Referring to FIG. 3, the first active thin-film layer 104 may be a halogen-containing $P_2O_5$ layer. $P_2O_5$ has a normal-tetrahedral structure or a normal-tetrahedron 1041. Within the first active thin-film layer 104, the halogen atom and the phosphorus atom located at the center of the normal-tetrahedron 1041 may form a two-dimensional single bond structure 1042. The plurality of the normal-tetrahedron 1041 may be randomly cross-linked with each other, and may further randomly cross-linked with a plurality of two-dimensional single bond structures 1042 to form a crosslinked-polyhedra-network structure. The crosslinked-polyhedra-network structure may lead to a dense and compact texture for the first active thin-film layer 104. Therefore, the first active thin-film layer 104 may efficiently block external water vapor and oxygen. In addition, the two-dimensional single bond structures 1042 may provide the first active thin-film layer 104 with a relatively low thermal expansion coefficient and desired interface adhesive ability. Further, the first active thin-film layer 104 may also have desired hydrophobic properties due to the introducing of a significant amount of halogen atoms.

Compared to the first active thin-film layer 104, the second active thin-film layer 105 may have a different mole ratio of oxygen atom to halogen atom. Specifically, the second active thin-film layer 105 may be formed by introducing more free oxygen atoms into the surface of the first active thin-film layer 104. Introducing oxygen atoms may convert the two-dimensional single bond structures 1042 in the second active thin-film layer 105 to more stable normal-tetrahedral structures 1041. Therefore, the crosslinked-polyhedra-network structure may become denser and more compact, leading to better performance in blocking water vapor.

In one embodiment, the second active thin-film layer 105 may cover the first active thin-film layer 104. From a microscopic view, the second active thin-film layer 105 and the first active thin-film layer 104 may be directly combined with each other.

As the second active thin-film layer 105 may be formed by introducing free oxygen atoms into the surface of the first active thin-film layer 104, the second active thin-film layer 105 may be microscopically combined with the first active thin-film layer 104 and thus form a unified component, i.e. the passivation layer 110. As such, the function of the passivation layer 110 to block external water vapor and oxygen may be further ensured.

In one embodiment, the passivation layer 110 may be a halogen-containing amorphous solid oxide thin film. The halogen-containing amorphous solid oxide thin film may include one or more of $Bi_2O_3$, $Al_2O_3$, $V_2O_5$, $TiO_2$, $P_2O_5$, $SiO_2$, $B_2O_3$, and $TeO_2$.

Specifically, the amorphous solid oxide thin film may include a plurality of polyhedral structures and two-dimensional chemical bonds. The plurality of polyhedral structures and two-dimensional chemical bonds may be cross-linked together so that the gaps between neighboring polyhedra and two-dimensional chemical bond structures may be small and the structure of the amorphous solid oxide thin film may be dense. Thus, the effect in blocking water vapor and oxygen may be remarkable.

In one embodiment, the passivation layer 110 may include a fluorine-containing $Bi_2O_3$ thin film, a fluorine-containing $SiO_2$ thin film, or a fluorine-containing composite thin film of $Bi_2O_3$ and $SiO_2$.

$Bi_2O_3$ has a crosslinked-polyhedra-network structure. The polyhedra forming the crosslinked-polyhedra-network structure are mainly octahedral structures constructed by Bi atoms and O atoms. Such octahedral structures are very stable, making the $Bi_2O_3$ thin film dense and compact. The fluorine atoms further provide the $Bi_2O_3$ thin film with desired hydrophobic properties and also reduce the surface energy of the thin film. Fluorine atoms and Bi atoms may also form two-dimensional single bonds, leading to a relatively low thermal expansion coefficient for the $Bi_2O_3$ thin film. With a low thermal expansion coefficient, the $Bi_2O_3$ thin film may not show any change in physical or chemical properties of the thin film when the environment temperature is changed.

In other embodiments, the mole ratio of oxygen atom to fluorine atom in the first active thin-film layer may be smaller than or equal to 0.5, while the mole ratio of oxygen atom to fluorine atom in the second active thin-film layer is larger than 0.5 but smaller than or equal to 0.9.

For example, in one embodiment, the mole ratio of oxygen atom to fluorine atom in the first active thin-film layer is 0.5 while the mole ratio of oxygen atom to fluorine atom in the second active thin-film layer is 0.9. With such mole ratios, a contact angle between liquid water and the surface of the first active thin-film layer may be 80 degrees while a contact angle between liquid water and the surface of the second active thin-film layer may be 60 degrees. Such contact angles indicate that the wettability of the first active thin-film layer and the wettability of the second active thin-film layer are both relatively low. Therefore, both the first active thin-film layer and the second active thin-film layer demonstrate desired hydrophobic properties.

In a first active thin-film layer formed with fluorine-containing $Bi_2O_3$, in addition to octahedral structures formed by most of the oxygen atoms and the bismuth atoms, the first active thin-film layer may also include triangular two-dimensional chemical bond structures formed by a portion of the oxygen and the bismuth atoms. Because the mole ratio of oxygen atom to fluorine atom in the second active thin-film layer is higher than that in the first active thin-film layer as more oxygen atoms are introduced in the second active thin-film layer, a portion of the triangular two-dimensional structures formed by chemical bonds between bismuth atoms and oxygen atoms may be converted to more stable, octahedral structures. Therefore, the gaps between neighboring octahedra may be reduced, thus the second active thin-film layer may become denser and more compact, leading to better performance in blocking water vapor and oxygen.

In other embodiments, the mole ratio of oxygen atom to fluorine atom in the first active thin-film layer may be 0.1, 0.2, 0.3, and 0.4, while the mole ratio of oxygen atom to fluorine atom in the second active thin-film layer may be 0.5, 0.6, 0.7, and 0.8.

Further, fluorine-containing $SiO_2$ thin films may also demonstrate similar chemical characteristics as fluorine-containing $Bi_2O_3$ thin films. In other embodiments, the passivation layer may include a fluorine-containing composite thin film including $SiO_2$ and $Bi_2O_3$. Such a fluorine-containing composite thin film including both $SiO_2$ and $Bi_2O_3$ may have more complex polyhedral network structures and even smaller gaps between neighboring polyhedra and two-dimensional chemical bond structures, thus demonstrate better performance in blocking water vapor and oxygen.

Optionally, the thickness of the first active thin-film layer may be in a range of 100 nm to 10 μm while the thickness of the second active thin-film layer may be in a range of 100 nm to 2 μm.

For the first active thin-film layer, when the thickness is smaller than 100 nm, the thin-film layer may not show desired performance in blocking water vapor and oxygen. However, when the thickness of the first active thin-film layer is greater than 10 μm, cracks may be formed in the first active thin-film layer due to thermal residual stress of the layer.

Compared to the first active thin-film layer, the second active thin-film layer may contain more free oxygen atoms. The maximum penetration depth of free oxygen atoms may be 2 μm. With the thickness taking such a value, the second active thin-film layer may demonstrate desired effect in blocking water vapor and oxygen. However, when the thickness of the second active thin-film layer is smaller than 100 nm, the second active thin-film layer may not be able to effectively block water vapor and oxygen.

In certain other embodiments, the passivation layer may also include tin and tungsten atoms. Specifically, by introducing tin and/or tungsten into the passivation layer, the hydrophobic properties of the passivation layer may be even better. In addition, introducing tungsten into the passivation layer may reduce the process temperature during the fabrication process of the passivation layer and, thus, reduce the challenges in the fabrication process of the passivation layer.

Figure 4:
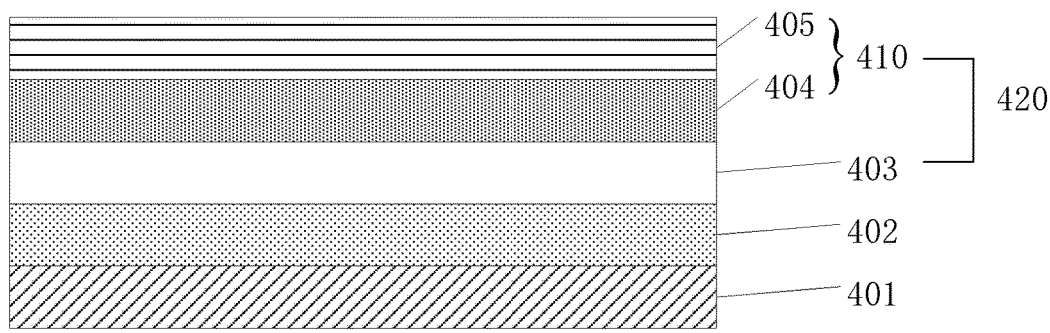
FIG. 4 illustrates a schematic view of an exemplary display device consistent with disclosed embodiments.

The present disclosure also provides a display device. FIG. 4 shows a schematic cross-section view of an exemplary display device consistent with disclosed embodiments.

Referring to FIG. 4, the display device 400 includes a substrate 401, a display layer 402 formed on the substrate 401, and a packaging structure 420 formed on the display layer 402. The packaging structure 420 may be any packaging structure consistent with above disclosed embodiments.

In the display device 400, the packaging structure 420 may be formed on the display layer 402 to provide protection for the display layer 402. Specifically, the packaging structure 420 may effectively prevent external water vapor and oxygen from invading into the display layer 402, thus may prevent damages to the display function of the display layer 402 due to the presence of water vapor and oxygen.

In one embodiment, a least one inorganic layer 403 may be formed between a passivation layer 410 and the display layer 402. The inorganic layer 403 may directly combine with the display layer 402. The passivation layer 410 may include a first active thin-film layer 404 and a second active thin-film layer 405.

Specifically, the packaging structure 420 may include at least one inorganic layer 403. The inorganic layer 403 may be located between the passivation layer 410 and the display layer 402. The inorganic layer 403 may serve as a first barrier in the packaging structure 420 to block water vapor and oxygen. Further, direct combination of the inorganic layer 403 and the display layer 402 may also provide protection for the display layer 402 so that the display layer 402 may not be affected by the passivation layer 410. Because the inorganic layer 403 may easily crack, the passivation layer 410 may be formed to cover the inorganic layer 403, thus providing a second barrier to block water vapor and oxygen. The passivation layer 410 may demonstrate desired hydrophobic properties and may include a crosslinked-polyhedra-network structure. Therefore, the passivation layer 410 may be relatively dense and compact, leading to desired performance in blocking water vapor and oxygen. Moreover, the second active thin-film layer 405 may be optional, and may be formed over the first active thin-film layer 404, which is formed over the display layer 402.

The second active thin-film layer 405 may have a denser network structure as compared to the first active thin-film layer 404. Therefore, forming the second active thin-film layer 405 as the top surface of the packaging structures 420 may lead to better performance in blocking water vapor and oxygen.

Figure 5:
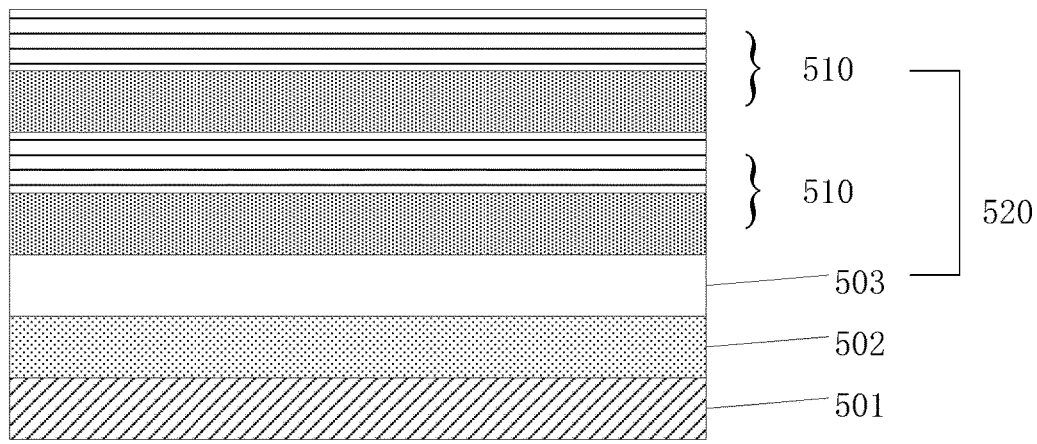
FIG. 5 illustrates a schematic view of another exemplary display device consistent with disclosed embodiments.

In other embodiments, the passivation layer may include a multiple-layer structure. FIG. 5 shows a schematic view of another exemplary display device consistent with disclosed embodiments. Referring to FIG. 5, the display device may include a substrate 501, a display layer 502 formed on the substrate 501, a packaging structure 520 formed on the display layer 502. Consistent with above disclosed embodiments, the packaging structure 520 may include at least one inorganic layer 503 and also at least one passivation layer 510.

Specifically, the display device 500 shown in FIG. 5 has a stacked structure formed by multiple passivation layers 510. Compared to a packaging structure with a single passivation layer (for example, the packaging structure 420 shown in FIG. 4), the packaging structure 520 with multiple passivation layers 510 may further improve the packaging performance, thus prevent water vapor and oxygen from invading into display layer 502.

Figure 6:
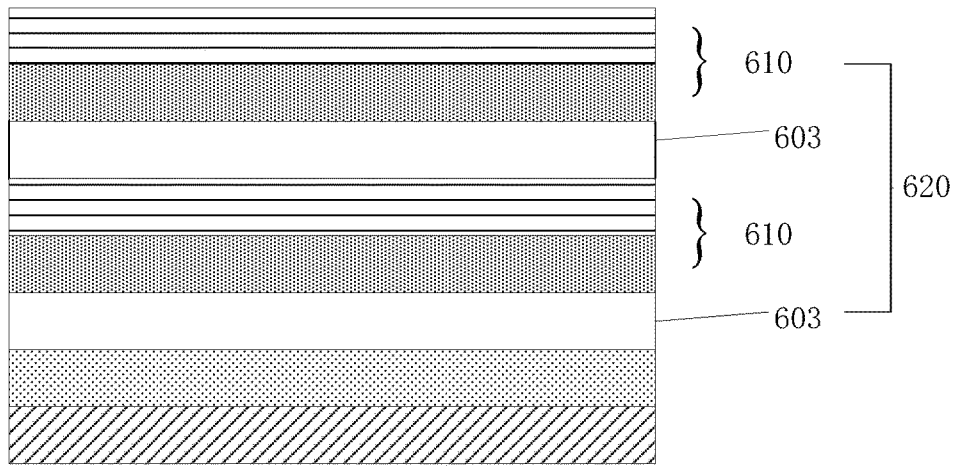
FIG. 6 illustrates a schematic view of another exemplary display device consistent with disclosed embodiments.

FIG. 6 shows schematic view of another exemplary display device consistent with disclosed embodiments. Referring to FIG. 6 and FIG. 5, different from the display device shown in FIG. 5, the display device shown in FIG. 6 includes a packaging structure 620 formed by alternating layers of passivation layers 610 and inorganic layers 603.

The inorganic layers 603 may demonstrate desired properties to block water vapor and oxygen. However, the inorganic layer may easily crack when an external force is applied. By alternatingly stacking passivation layers 610 and inorganic layers 603, each inorganic layers 603 may then be covered by a corresponding passivation layer 610, thus negative influence of cracks in the inorganic layers may be greatly diminished. In addition, because the passivation layers 610 may have a dense and compact texture and also demonstrate desired hydrophobic properties, the packaging performance of the packaging structure 620 may be further improved, ensuring the performance in preventing water vapor and oxygen from invading into the display layer.

Figure 7:
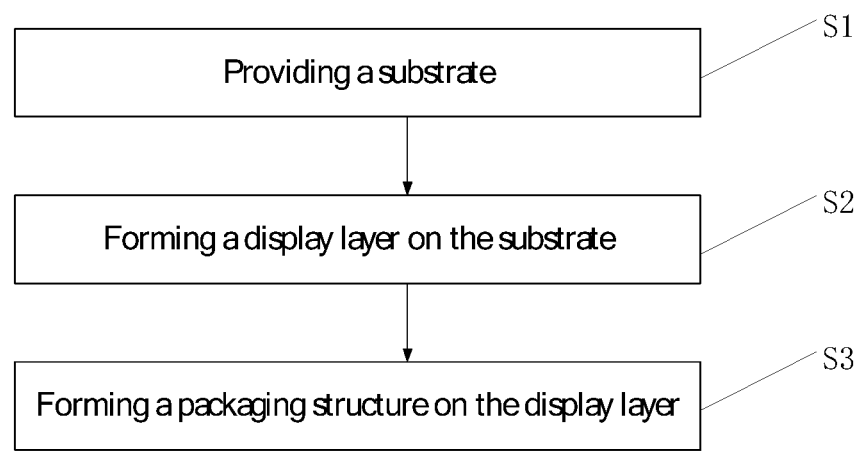
FIG. 7 illustrates a flowchart for fabricating an exemplary display device consistent with disclosed embodiments.

The present disclosure also provides a method for fabricating a display device consistent with above disclosed embodiments. FIG. 7 shows a flowchart of an exemplary fabrication process for the display device consistent with disclosed embodiments.

Referring to FIG. 7, the fabrication process may include the following steps:

First, at the beginning of the fabrication process, a substrate is provided (S1);

Further, a display layer may be formed on the substrate (S2); and

Finally, a packaging structure may then be formed on the display layer (S3).

Specifically, forming the packaging structure on the display layer may further include the following steps.

First, after forming the display layer, at least one inorganic layer may be formed on the display layer (S3b).

The inorganic layer may be formed by physical vapor deposition (PVD) such as sputtering, or by chemical vapor deposition (CVD). The inorganic layer may be made of one or more of $SiO_2$, $AlO_x$, SiN, SiON, and SiOC.

In one embodiment, the inorganic layer may be formed prior to the formation of the passivation layer. That is, the inorganic layer may be formed between the passivation layer and the display layer so that the inorganic layer may be directly combined with the display layer. Optionally, the display layer may include organic electroluminescent devices.

Further, at least one passivation layer may be formed (S3a). The passivation layer may include a halogen-containing amorphous solid oxide thin film. The halogen-containing amorphous solid oxide thin film may include a crosslinked-polyhedra-network structure.

The crosslinked-polyhedra-network structure may be formed by a plurality of polyhedra randomly cross-linked with each other. Each polyhedron may be formed by a plurality of atoms linked through chemical bonds. The polyhedral structures may include one or more of tetrahedron, hexahedron, octahedron, icosahedron, etc.

Further, the crosslinked-polyhedra-network structure may also include two-dimensional chemical bond structures. Such two-dimensional chemical bond structures may include one or more of single bond structure, triangular structure, polygonal structure, etc.

Figure 8:
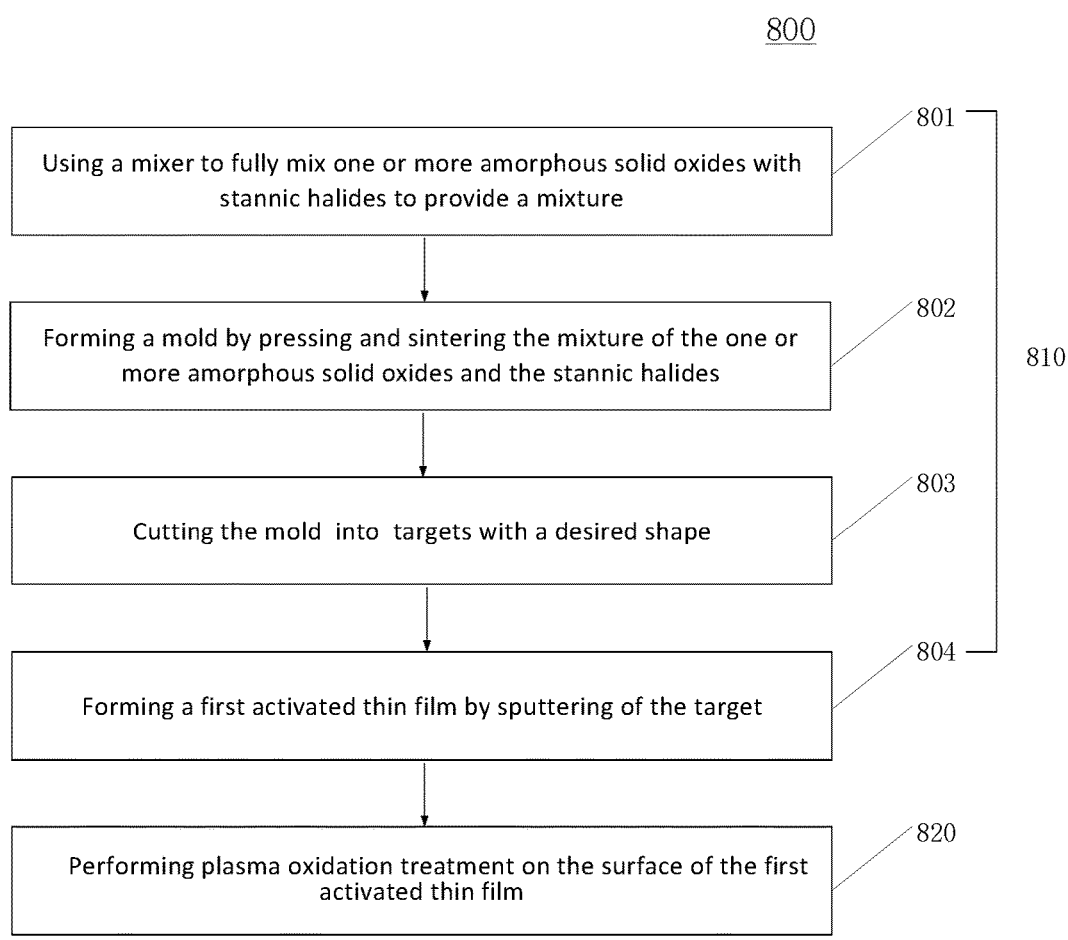
FIG. 8 illustrates a flowchart for fabricating an exemplary passivation layer consistent with disclosed embodiments.

In one embodiment, the passivation layer formed on the display layer may include a first active thin-film layer and a second active thin-film layer. Specifically, the mole ratio of oxygen atom to halogen atom in the first active thin-film layer may be different from the mole ratio of oxygen atom to halogen atom in the second active thin-film layer. Correspondingly, Step S3a for forming the passivation layer may further include forming the first active thin-film layer and then forming the second active thin-film layer. FIG. 8 shows a flowchart for fabricating the passivation layer consistent with disclosed embodiments.

Referring to FIG. 8, to form the passivation layer, a first active thin film may be formed first (810). The process to form the first active thin film may further include the following steps.

Step 801, a mixer may be used to fully mix one or more amorphous solid oxides with stannic halides.

Step 802, the mixture may then be pressed using a vibratory press method and then sintered through hot-pressing. During the sintering process, the chemical bonds in each component of the mixture may be broken and then new chemical bonds may be formed. After the sintering process, a mold may be formed.

Step 803, the mold obtained after pressing and sintering may be cut into one or more pieces to form targets with a desired shape.

Step 804, a first active thin film may be formed by sputtering one of the obtained targets. The first active thin film may be formed by bombarding the target with argon ions. During the sputtering process, the pressure in the chamber may be 100 mTorr.

The first active thin film obtained after sputtering may have a same material and a same texture as the first active thin-film layer to be formed. The thickness of the first active thin film formed by sputtering may be larger than the thickness of the first active thin-film layer. That is, the first active thin film formed by sputtering may include two portions: a bottom portion that corresponds to the first active thin-film layer and a top portion that may be converted to a second active thin-film layer in a subsequent plasma oxidation process.

In Step 801, the amorphous solid oxide thin film may include one or more of $Bi_2O_3$, $Al_2O_3$, $V_2O_5$, $TiO_2$, $P_2O_5$, $SiO_2$, $B_2O_3$, and $TeO_2$.

In one embodiment, $Bi_2O_3$, $SiO_2$, or a combination of the two may be used to mix with stannic fluoride; the mixture may then be used to form the thin film following the fabrication process described above.

Optionally, in Step 801, tungsten oxide may also be added into the mixture to form the film. Specifically, adding tungsten oxide into the mixture may reduce the process temperature for thin film fabrication, and may also further improve the hydrophobic properties of the passivation layer.

In one embodiment, the weight percentage of $Bi_2O_3$ in the mixture described in Step 801 may be in a range of 62% to 73%. When the weight percentage of $Bi_2O_3$ is too high, the thermal expansion coefficient of the film layer may be large, leading to undesired thermal stability for the film layer. When the weight percentage of $Bi_2O_3$ is too low, the desired network structure may not be effectively formed.

Further, the weight percentage of $SiO_2$ may be in a range of 1% to 5%; the weight percentage of stannic fluoride may be in a range of 20% to 25%; and the weight percentage of tungsten oxide may be in a range of 1% to 12%.

Incorporating stannic fluoride and tungsten oxide into the mixture may effectively reduce the melting temperature of the composite target, thus reduce the process temperature. However, when an excessive amount of stannic fluoride and tungsten oxide is added, the properties of the film layer may be affected.

Returning to FIG. 8, after the formation of the first active thin film, a top portion of the first active thin film formed by sputtering may be treated by oxygen plasma to form the second active thin-film layer (820). Correspondingly, the bottom portion of the first active thin film covered by the second active thin-film layer may become the first active thin-film layer.

By performing the plasma oxidation treatment process on the surface of the first active thin-film layer, more free oxygen atoms may be introduced. The introduced free oxygen atoms may help converting some of the two-dimensional chemical bond structures in the crosslinked-polyhedra-network structure into more stabilized polyhedral structures. As such, the gaps between neighboring polyhedra may become smaller while the crosslinked-polyhedra-network structure may become denser and more compact.

In one embodiment, the second active thin-film layer may be on the far-side surface of the packaging structure away from the display layer.

Optionally, the chemical formula of the formed first active thin-film layer may be $Bi_{0.6-0.8}Si_{0.1-0.25}Sn_{0.3-0.4}W_{0.1-0.15}O_{0.3-0.8}F_{0.6-0.8}$; and the chemical formula of the formed second active thin-film layer may be $Bi_{0.6-0.8}Si_{0.1-0.25}Sn_{0.3-0.4}W_{0.1-0.15}O_{0.3-0.4}F_{0.6-0.8}$.

Further, in Step 804, the thickness of the first active thin film formed after sputtering may be in a range of 100 nm to 10 μm; while in Step 820, the thickness of the second active thin-film layer formed by performing a plasma oxidation treatment process on the surface of the first active thin film may be in a range of 100 nm to 2 μm.

In other embodiments, multiple passivation layers may be formed and each passivation layer may further include a first active thin-film layer and a second active thin-film layer. Correspondingly, the above steps for forming a single passivation layer may be repeated to complete such a multiple-layer structure.

In certain other embodiments, the packaging structure may be formed by alternatingly stacking passivation layers with the inorganic layers. Correspondingly, the above steps for forming an inorganic layer and a passivation layer may be repeated to complete the packaging structure.

Moreover, in other embodiments, the fabrication steps may not be performed in the exact order as described above. For example, a passivation layer may be formed between a display layer and an inorganic layer. That is, the passivation layer may be formed before the inorganic layer is formed.

According to the disclosed packaging structures, display devices, and fabrication methods, the passivation layer may include halogen-containing amorphous solid oxide thin films. The chemical structure of the halogen-containing amorphous solid oxide thin films may have a crosslinked-polyhedra-network structure to provide dense films. Specifically, a first active thin-film layer in the passivation layer may have a relatively high halogen concentration, allowing the first active thin-film layer to have ideal hydrophobic properties. In addition, the surface activity of the first active thin-film layer may be reduced, thus the film may have a relatively low thermal expansion coefficient and desired surface adhesive ability. A second active thin-film layer in the passivation layer may have a higher oxygen concentration as compared to the first active thin-film layer. Specifically, a substantial amount of free oxygen atoms introduced into the second active thin-film layer may make the chemical structure of the film layer very dense and defect free, which may further lead to ideal properties for blocking water vapor and oxygen.

Further, the structure of the disclosed passivation layer is relatively simple, thus the corresponding fabrication process is also relatively easy. Moreover, by eliminating the organic-inorganic multiple-layer structure used in existing packaging structures, the disclosed packaging structure, the corresponding display device, and the fabrication method may significantly reduce the cost.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A packaging structure for a display device, comprising:
at least one inorganic layer and at least one passivation layer,
wherein:
the at least one passivation layer includes a halogen-containing amorphous solid oxide thin film having a crosslinked-polyhedra-network structure,
the at least one passivation layer includes a first active thin-film layer and a second active thin-film layer,
a mole ratio of oxygen atom to halogen atom in the first active thin-film layer is lower than a mole ratio of oxygen atom to halogen atom in the second active thin-film layer,
the at least one passivation layer covers an entire surface of the at least one inorganic layer,
the at least one inorganic layer is arranged between a display layer of the display device and the at least one passivation layer, and directly combined with the display layer,
the first active thin-film layer in the at least one passivation layer is arranged between the display layer of the display device and the second active thin-film layer in the at least one passivation layer, and
the first active thin-film layer has a chemical formula of $Bi_{0.6-0.8}Si_{0.1-0.25}Sn_{0.3-0.4}W_{0.1-0.15}O_{0.3-0.8}F_{0.6-0.8}$.

2. The packaging structure according to claim 1, wherein:
the crosslinked-polyhedra-network structure includes a plurality of polyhedra randomly crosslinked with each other; and
each polyhedron in the crosslinked-polyhedra-network structure includes a plurality of atoms linked through chemical bonds.

3. The packaging structure according to claim 2, wherein the crosslinked-polyhedra-network structure further includes a plurality of two-dimensional chemical bond structures.

4. The packaging structure according to claim 1, wherein:
in the at least one passivation layer, the second active thin-film layer covers the first active thin-film layer; and
the second active thin-film layer is formed by introducing free oxygen atoms into a surface of the first active thin-film layer, such that the second active layer is microscopically combined with the first active thin-film layer at the surface of the first active thin-film layer.

5. The packaging structure according to claim 4, wherein the second active thin-film layer contains more free oxygen atoms than the first active thin-film layer.

6. The packaging structure according to claim 4, wherein a maximum penetration depth of the free oxygen atoms in the second active thin-film layer is 2 μm.

7. The packaging structure according to claim 1, wherein the halogen-containing amorphous solid oxide thin film includes one or more of $Bi_2O_3$, $Al_2O_3$, $V_2O_5$, $TiO_2$, $P_2O_5$, $SiO_2$, $B_2O_3$, and $TeO_2$.

8. The packaging structure according to claim 1, wherein the at least one passivation layer includes a fluorine-containing $Bi_2O_3$ thin film, a fluorine-containing $SiO_2$ thin film, or a fluorine-containing composite thin film of $Bi_2O_3$ and $SiO_2$.

9. The packaging structure according to claim 1, wherein:
the halogen atom in the second active thin-film layer is a fluorine atom;
a mole ratio of the oxygen atom to the fluorine atom in the second active thin-film layer is larger than 0.5 but smaller than or equal to 0.9.

10. The packaging structure according to claim 1, wherein:
a thickness of the first active thin-film layer is in a range of 100 nm to 10 μm; and
a thickness of the second active thin-film layer is in a range of 100 nm to 2 μm.

11. The packaging structure according to claim 1, wherein the halogen-containing amorphous solid oxide thin film also includes tin atoms and tungsten atoms.

12. The packaging structure according to claim 1, wherein the at least one inorganic layer is made of one or more of $SiO_2$, $AlO_x$, $SiN$, $SiON$, and $SiOC$.

13. The packaging structure according to claim 1, wherein a weight percentage of $Bi_2O_3$ is in a range of 60% to 80%.

14. A packaging structure for a display device, comprising:
at least one inorganic layer and at least one passivation layer,
wherein:
the at least one passivation layer includes a halogen-containing amorphous solid oxide thin film; and
the amorphous solid oxide thin film in the at least one passivation layer has a crosslinked-polyhedra-network structure,
wherein the at least one passivation layer includes a first active thin-film layer and a second active thin-film layer,
a mole ratio of oxygen atom to halogen atom in the first active thin-film layer is lower than a mole ratio of oxygen atom to halogen atom in the second active thin-film layer,
the at least one passivation layer covers an entire surface of the at least one inorganic layer,
the at least one inorganic layer is arranged between the display device and the at least one passivation layer, and
the first active thin-film layer in the at least one passivation layer is arranged between the display device and the second active thin-film layer in the at least one passivation layer,
wherein the first active thin-film layer has a chemical formula of $Bi_{0.6-0.8}Si_{0.1-0.25}Sn_{0.3-0.4}W_{0.1-0.15}O_{0.3-0.8}F_{0.6-0.8}$, and the second active thin-film layer has a chemical formula of $Bi_{0.6-0.8}Si_{0.1-0.25}Sn_{0.3-0.4}W_{0.1-0.15}O_{0.3-0.4}F_{0.6-0.8}$.

15. The packaging structure for a display device according to claim 14, wherein:
the crosslinked-polyhedra-network structure includes a plurality of polyhedra randomly crosslinked with each other; and
each polyhedron in the crosslinked-polyhedra-network structure includes a plurality of atoms linked through chemical bonds.

16. The packaging structure according to claim 15, wherein the crosslinked-polyhedra-network structure further includes a plurality of two-dimensional chemical bond structures.

17. The packaging structure according to claim 14, wherein:
a thickness of the first active thin-film layer is in a range of 100 nm to 10 μm; and a thickness of the second active thin-film layer is in a range of 100 nm to 2 μm.

* * * * *